United States Patent
Iucolano et al.

(10) Patent No.: US 11,038,047 B2
(45) Date of Patent: *Jun. 15, 2021

(54) NORMALLY-OFF HEMT TRANSISTOR WITH SELECTIVE GENERATION OF 2DEG CHANNEL, AND MANUFACTURING METHOD THEREOF

(71) Applicant: STMICROELECTRONICS S.R.L., Agrate Brianza (IT)

(72) Inventors: Ferdinando Iucolano, Gravina di Catania (IT); Giuseppe Greco, Misterbianco (IT); Fabrizio Roccaforte, Mascalucia (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 16/738,935

(22) Filed: Jan. 9, 2020

(65) Prior Publication Data

US 2020/0152779 A1 May 14, 2020

Related U.S. Application Data

(63) Continuation of application No. 16/004,272, filed on Jun. 8, 2018, now Pat. No. 10,566,450.

(51) Int. Cl.
*H01L 29/778* (2006.01)
*H01L 29/20* (2006.01)
(Continued)

(52) U.S. Cl.
CPC ........ *H01L 29/7786* (2013.01); *H01L 23/291* (2013.01); *H01L 23/3171* (2013.01);
(Continued)

(58) Field of Classification Search
None
See application file for complete search history.

(56) References Cited

U.S. PATENT DOCUMENTS 7,449,762 B1 11/2008 Singh
9,035,353 B2 5/2015 Ohki et al.
(Continued)

FOREIGN PATENT DOCUMENTS

CN 106298905 A 1/2017

OTHER PUBLICATIONS

Roccaforte, F., et. al., "Epitaxial NiO gate dielectric on AlGaN/GaN heterostructures", Applied Physics Letters, 100 063511 (2012) (Year: 2012).*

(Continued)

*Primary Examiner* — J. E. Schoenholtz
(74) *Attorney, Agent, or Firm* — Seed IP Law Group LLP (57) ABSTRACT

A normally-off HEMT transistor includes a heterostructure including a channel layer and a barrier layer on the channel layer; a 2DEG layer in the heterostructure; an insulation layer in contact with a first region of the barrier layer; and a gate electrode through the whole thickness of the insulation layer, terminating in contact with a second region of the barrier layer. The barrier layer and the insulation layer have a mismatch of the lattice constant ("lattice mismatch"), which generates a mechanical stress solely in the first region of the barrier layer, giving rise to a first concentration of electrons in a first portion of the two-dimensional conduction channel which is under the first region of the barrier layer which is greater than a second concentration of electrons in a second portion of the two-dimensional conduction channel which is under the second region of the barrier layer.

20 Claims, 5 Drawing Sheets

(51) Int. Cl.
*H01L 29/66* (2006.01)
*H01L 29/10* (2006.01)
*H01L 29/423* (2006.01)
*H01L 23/29* (2006.01)
*H01L 23/31* (2006.01)
*H01L 29/737* (2006.01)
*H01L 29/207* (2006.01)
*H01L 29/417* (2006.01)

(52) U.S. Cl.
CPC ...... *H01L 29/1066* (2013.01); *H01L 29/2003* (2013.01); *H01L 29/4236* (2013.01); *H01L 29/66462* (2013.01); *H01L 29/1087* (2013.01); *H01L 29/207* (2013.01); *H01L 29/41766* (2013.01); *H01L 29/7378* (2013.01)

(56) References Cited

U.S. PATENT DOCUMENTS

| | | | |
|---|---|---|---|
| 9,111,851 | B2 | 8/2015 | Kuo et al. |
| 10,566,450 | B2 * | 2/2020 | Iucolano ............... H01L 23/291 |
| 10,700,201 | B2 * | 6/2020 | Khalil ................ H01L 29/7848 |
| 10,741,666 | B2 * | 8/2020 | Chou .................... H01L 23/552 |
| 2007/0164322 | A1 | 7/2007 | Smith et al. |
| 2010/0025730 | A1 | 2/2010 | Heikman et al. |
| 2011/0018040 | A1 | 1/2011 | Smith et al. |
| 2011/0057232 | A1 | 3/2011 | Sheppard et al. |
| 2013/0001646 | A1 * | 1/2013 | Corrion ............. H01L 29/66462 257/194 |
| 2013/0082400 | A1 | 4/2013 | Ohki et al. |
| 2013/0256685 | A1 | 10/2013 | Ohki |
| 2014/0239307 | A1 | 8/2014 | Dargis et al. |
| 2014/0335666 | A1 * | 11/2014 | Koehler ............ H01L 21/02458 438/172 |
| 2015/0221758 | A1 * | 8/2015 | Miura ................... H01L 29/205 257/76 |
| 2015/0236121 | A1 | 8/2015 | Chiu et al. |
| 2016/0020313 | A1 * | 1/2016 | Wu ..................... H01L 21/3081 257/194 |
| 2016/0365419 | A1 | 12/2016 | Kanamura |
| 2017/0148906 | A1 | 5/2017 | Iucolano et al. |
| 2018/0138305 | A1 * | 5/2018 | Deng .................. H01L 29/7786 |
| 2018/0158909 | A1 * | 6/2018 | Mishra .............. H01L 29/41766 |
| 2018/0269282 | A1 * | 9/2018 | Yang ....................... H01L 29/36 |
| 2018/0294335 | A1 * | 10/2018 | Luo ..................... H01L 29/7827 |
| 2018/0350944 | A1 | 12/2018 | Huang |

OTHER PUBLICATIONS

Ambacher, et al., "Two Dimensional Electron Gases Induced by Spontaneous and Piezoelectric Polarization Charges in N- and Ga-face AlGaN/GaN Heterostructures," *Journ. of Appl. Phys.*, 85(6): 3222-3233, 1999.

Fiorenza et al., "High Permittivity Cerium Oxide Thin Films on AlGaN/GaN Heterostructures," *Applied Physics Letters*, 103:112905, 2013. (5 pages).

Ihlefeld et al., "AlGaN Composition Dependence of the Band Offsets for Epitaxial $Gd_2O_3/Al_xGa_{1-x}N$ ($0 \leq x \leq 0.67$) Heterostructures," *Applied Physics Letters*, 105:012102, 2014. (4 pages).

Ihlefeld et al., "Band Offsets of $La_2O_3$ on (0001) GaN Grown by Reactive Molecular-Beam Epitaxy," *Applied Physics Letters*, 102:162903, 2013. (4 pages).

Im et al., "Normally Off GaN MOSFET Based on AlGaN/GaN Heterostructure with Extremely High 2DEG Density Grown on Silicon Substrate," *IEEE Electron Device Letters*, 31(3):192-194, 2010.

Lim et al., "Normally-Off Operation of Recessed Gate AlGaN/GaN HFETs for High Power Applications," *Electrochem. Solid State Lett.*, 14(5):205-207, 2011.

Roccaforte et al., "Epitaxial NiO Gate Dielectric on AlGaN/GaN Heterostructures," *Appl. Phys. Lett.*, 100:063511, 2012. (4 pages).

Uemoto et al., "Gate Injection Transistor (GIT)—A Normally-Off AlGaN/GaN Power Transistor Using Conductivity Modulation," *IEEE Transactions on Electron Devices*, 54(12):3393-3399, 2007.

* cited by examiner

Fig.5F

NORMALLY-OFF HEMT TRANSISTOR WITH SELECTIVE GENERATION OF 2DEG CHANNEL, AND MANUFACTURING METHOD THEREOF

BACKGROUND

Technical Field

The present disclosure relates to a normally-off high electron mobility field effect transistor ("high electron mobility transistor", or HEMT), and to a method for manufacturing the HEMT transistor. In particular, the present disclosure relates to a normally-off HEMT transistor incorporating an epitaxial layer of nickel oxide.

Description of the Related Art

There are known high electron mobility field effect transistors ("high electron mobility transistors", or HEMT) based on the formation of high-mobility two-dimensional electron gas (2DEG) layers at a heterojunction, that is to say at the interface between semiconductor materials having different band gaps. For example, there are known HEMT transistors based on the heterojunction between a layer of aluminum gallium nitride (AlGaN) and a layer of gallium nitride (GaN).

HEMT transistors based on AlGaN/GaN heterojunctions offer a number of advantages which makes them particularly suitable and widely used for various applications. For example, use is made of the high breakdown threshold of HEMT transistors for high-performance power switches; the high mobility of the electrons in the conduction channel enables high-frequency amplifiers to be produced; furthermore, the high concentration of electrons in the 2DEG provides low ON-state resistance (Rory).

Owing to the high cost of gallium nitride substrates, HEMT transistors based on AlGaN/GaN heterojunctions are usually made by growing AlGaN and GaN layers on silicon substrates. HEMT transistors made in this way are therefore of the planar type; that is to say, they have source, gate and drain electrodes aligned on a plane parallel to the substrate.

To facilitate the use of HEMT transistors in high-power applications, normally-off channel HEMT transistors have been introduced.

A known solution for the production of normally-off HEMT transistors consists in the use of recessed-gate terminals. An example of a device of this type is known from Wantae Lim et al., "Normally-Off Operation of Recessed-Gate AlGaN/GaN HFETs for High Power Applications", Electrochem. Solid-State Lett. 2011, volume 14, issue 5, H205-H207. However, this solution has drawbacks due to low electron mobility in the region below the gate region, and poor reliability of the gate dielectric owing to possible breakdowns caused by high electrical fields between the gate region and the drain region.

Another type of normally-off HEMT transistor is what is known as a "p-GaN" gate transistor, in which the gate region comprises a gate electrode extending over a p-GaN region. This solution has drawbacks such as high sheet resistance seen from the gate region and the need to limit the voltage applied to the gate electrode at values below 6 V.

Consequently, it has been felt necessary to provide a normally-off HEMT transistor which overcomes at least some of the aforementioned problems.

BRIEF SUMMARY

According to the present disclosure, therefore, a normally-off HEMT transistor that includes a semiconductor heterostructure including a semiconductor channel layer and a semiconductor barrier layer on the channel layer, a two-dimensional conduction channel within the heterostructure, an insulation layer in contact with a first region of the barrier layer, and a gate electrode extending through an entire thickness of the insulation layer, terminating in contact with a second region of the barrier layer. The barrier layer and the insulation layer have a mismatch of lattice constants ("lattice mismatch"), which generates a mechanical stress in the first region of the barrier layer, giving rise to a first concentration of electrons in a first portion of the two-dimensional conduction channel which is under the first region of the barrier layer which is greater than a second concentration of electrons in a second portion of the two-dimensional conduction channel which is under the second region of the barrier layer.

A method for manufacturing an HEMT transistor includes forming a heterostructure, including forming a channel layer and forming a barrier layer on the channel layer, thus generating a two-dimensional conduction channel within the heterostructure; forming an insulation layer in contact with a first region of the barrier layer; and forming a gate electrode through an entire thickness of the insulation layer, in contact with a second region of the barrier layer. Forming the barrier layer and the insulation layer comprise generating a mechanical stress solely in the first region of the barrier layer, resulting from a mismatch of the lattice constant ("lattice mismatch") between the barrier layer and the insulation layer, said mechanical stress giving rise to a first concentration of electrons in a first portion of the two-dimensional conduction channel under the first region of the barrier layer which is greater than a second concentration of electrons in a second portion of the two-dimensional conduction channel under the second region of the barrier layer.

BRIEF DESCRIPTION OF THE SEVERAL VIEWS OF THE DRAWINGS

To enable the present disclosure to be understood more readily, preferred embodiments thereof will now be described, purely by way of non-limiting example, with reference to the attached drawings, in which.

DETAILED DESCRIPTION

Figure 1:
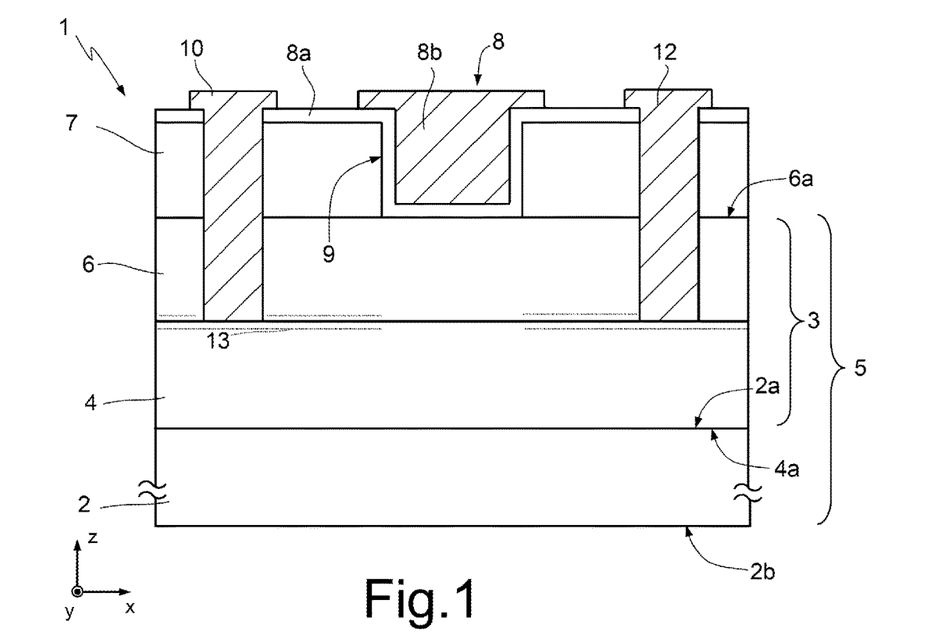
FIG. 1 shows, in a cross-sectional view, a HEMT transistor according to an embodiment of the present disclosure.

FIG. 1 shows, in a three-axis system having axes X, Y, Z orthogonal to one another, a normally-off HEMT device 1 including a substrate 2, made for example of silicon or silicon carbide (SiC) or sapphire ($Al_2O_3$); a channel layer 4, of intrinsic gallium nitride (GaN), extending over the substrate 2 and having a thickness in the range from about 1 μm to 5 μm; a barrier layer 6, of intrinsic aluminum gallium nitride (AlGaN) or, more generally, of compounds based on ternary or quaternary alloys of gallium nitride, such as $Al_xGa_{1-x}N$, AlInGaN, $In_xGa_{1-x}N$, $Al_xIn_{1-x}Al$, extending over the channel layer 4 and having a thickness $t_b$ in the range from about 5 nm to 30 nm; an insulation layer 7, of dielectric material such as nickel oxide (NiO), extending on an upper side 6a of the barrier layer 6; and a gate region 8 extending into the insulation layer 7 between a source region 10 and a drain region 12.

The channel layer 4 and the barrier layer 6 form a heterostructure 3. The substrate 2, the channel layer 4 and the barrier layer 6 are referred to below as a whole by the term "semiconductor body" 5. The heterostructure 3 therefore extends between a lower side 4a of the channel layer 4, which is part of the interface with the underlying substrate 2, and an upper side 6a of the barrier layer 6. The channel layer 4 and the barrier layer 6 are usually made of materials such that, when coupled together as shown in FIG. 1, they form a heterojunction which allows the formation of a region 13, or layer, of two-dimensional gas (2DEG).

The gate region 8 is separated laterally (that is to say, along X) from the source region 10 and the drain region 12 by respective portions of the insulation layer 7. The gate region 8 is of the recess type; that is to say, it extends in depth through the insulation layer 7 to reach the barrier layer 6. In other words, the gate region 8 is formed in a trench 9 excavated through the insulation layer 7; optionally, the trench 9 extends through part of the barrier layer 6 and terminates within the barrier layer 6. Optionally, according to a further embodiment, the trench 9 extends completely through part of the barrier layer 6. A gate dielectric layer 8a extends into the trench 9, facing the bottom and lateral walls of the trench 9. A gate metallization 8b completes the filling of the trench 9 and extends onto the gate dielectric layer 8a. The gate dielectric layer 8a and the gate metallization 8b form the gate region of the HEMT device 1.

The source region 10 and the drain region 12, made of conductive material, for example a metallic material, extend in depth in the semiconductor body 5, through the whole of the barrier layer 6, terminating at the interface between the barrier layer 6 and the channel layer 4.

According to one aspect of the present disclosure, the 2DEG region extends to the interface between the channel layer 4 and the barrier layer 6 under the insulation layer 7, that is to say in interface portions between the channel layer 4 and the barrier layer 6 corresponding to the projection of the insulation layer 7 along Z. In particular, since the gate dielectric layer 8a extends through the whole thickness (along the Z axis) of the insulation layer 7, to reach and contact the barrier layer 6, the 2DEG region is not present under the gate region 8; in particular, the 2DEG region is not present in interface portions between the channel layer 4 and the barrier layer 6 corresponding to the projection along Z of the portion of the gate region 8 which is in contact with the barrier layer 6.

According to further embodiments, the semiconductor body 5 may comprise, if required, a single layer or more layers of GaN, or alloys of GaN, suitably doped or of the intrinsic type.

Figure 2:
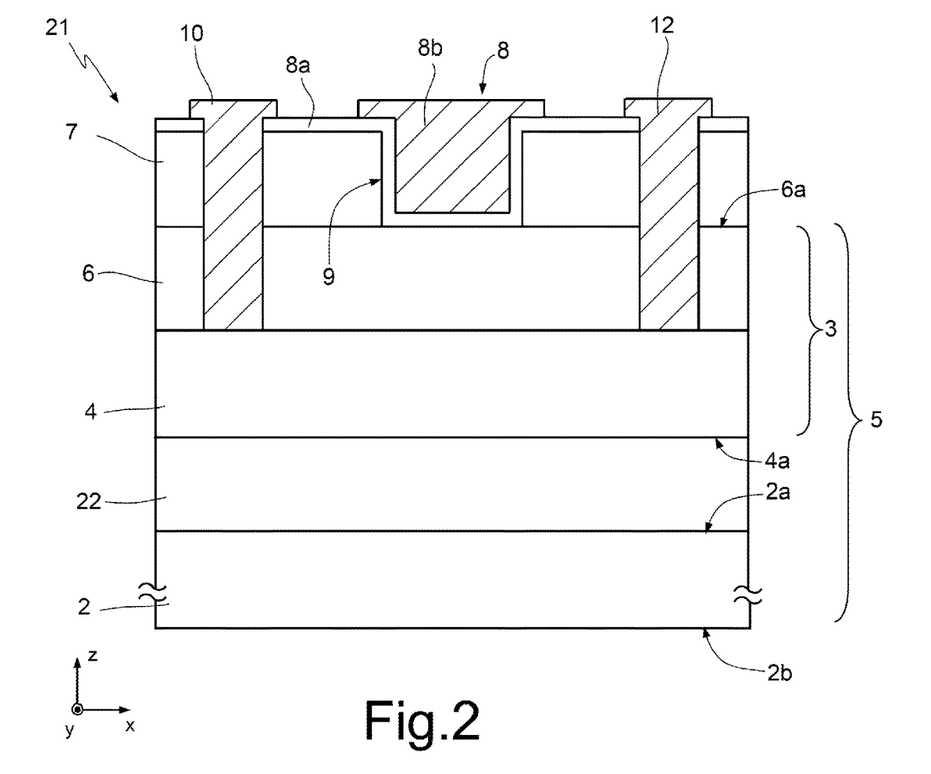
FIG. 2 shows, in a cross-sectional view, a HEMT transistor according to a further embodiment of the present disclosure.

For example, FIG. 2 shows a normally-off HEMT transistor 21 according to a further embodiment of the present disclosure, in which the semiconductor body 5 also comprises a buffer layer 22 between the substrate 2 and the heterostructure 3. Elements of the HEMT transistor 21 of FIG. 2 common to the HEMT transistor 1 of FIG. 1 are identified by the same reference numerals and are not described further. With reference to FIG. 2, the buffer layer 22 allows better depletion of the two-dimensional electron gas (2DEG) in the conduction channel in the gate region, and is particularly useful for reducing the vertical leakage currents.

Figure 3:
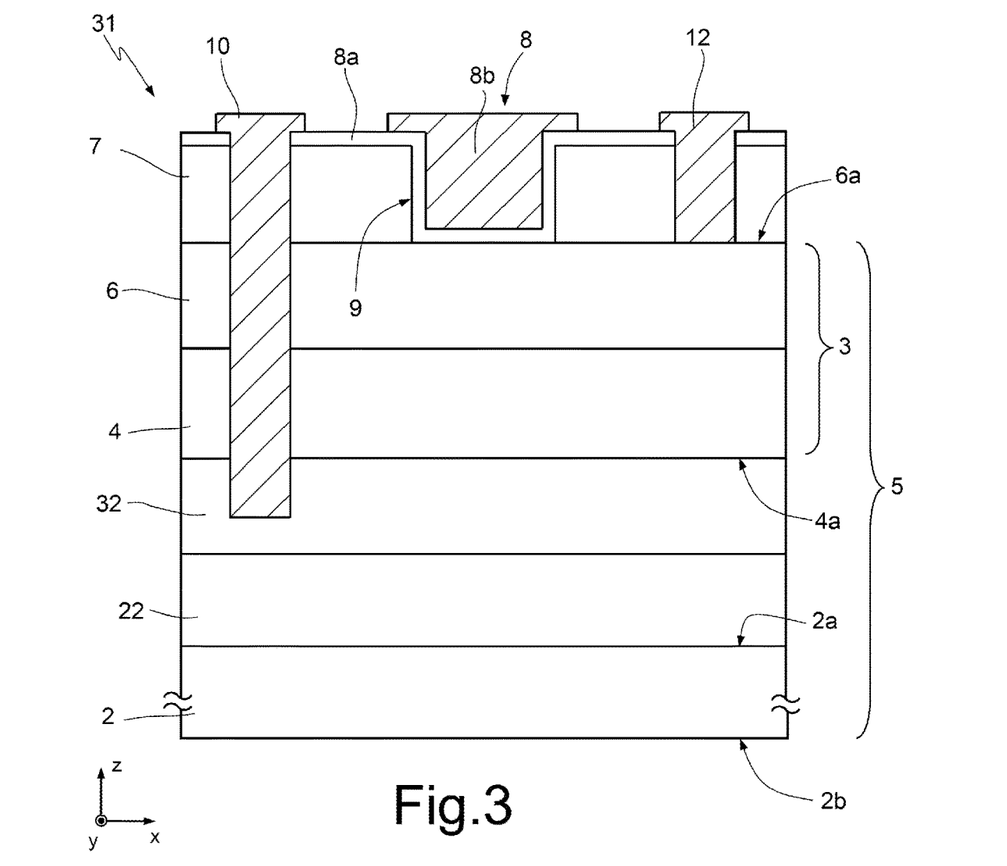
FIG. 3 shows, in a cross-sectional view, a HEMT transistor according to a further embodiment of the present disclosure.

FIG. 3 shows a normally-off HEMT transistor 31 according to a further embodiment of the present disclosure. Elements of the HEMT transistor 31 of FIG. 3 common to the HEMT transistor 21 of FIG. 2 are identified by the same reference numerals and are not described further. With reference to FIG. 3, the HEMT transistor 31 comprises a buried layer 32, extending between the buffer layer 22 and the heterostructure 3.

The applicant has found that, since the buffer layer 22 includes impurities, such as carbon, used in a way that is known per se for attenuating the vertical leakage towards the substrate 2, the buffer layer 22 has a high concentration of trap states which promote hole emission and therefore cause the formation of a layer of negative charges within the buffer layer 22, which reduce the concentration of electrons in the 2DEG region and thus increase the ON-state resistance of the HEMT transistor.

To overcome this drawback, the buried layer 32 is made of P-type doped semiconductor material, and the source region 10 is in direct electrical contact with the buried layer 32, so that the buried layer 32 can be biased to promote the transport of holes from the buried layer 32 to the buffer layer 22. The layer of negative charges in the buffer layer 22 is therefore neutralized.

With the aim of optimizing this process, the applicant has found that a thickness $t_u$ of the channel layer 4, a surface concentration $N_A$ of dopant species of the buried layer 32 and a thickness $t_p$ of the buried layer 32 are preferably chosen, according to the following relation:

$$t_p > -t_u + \sqrt{t_u^2 + 2\frac{\varepsilon B}{qN_A}} + \sqrt{\frac{2\varepsilon E_A}{qN_A}} \qquad (1)$$

where q is the elementary charge; B is the band gap of the semiconductor material of the buffer layer 22; $E_A$ is the distance of trap states from the valence band of the buffer layer 22; and $\varepsilon$ is the dielectric constant of the semiconductor material of the hole supply layer 32. In particular, the thickness $t_u$ of the channel layer 4 is in the range from 100 nm to 500 nm, the surface concentration $N_A$ of dopant species of the buried layer 32 is greater than $6 \cdot 10^{16}$ cm$^{-2}$, and the thickness $t_p$ of the buried layer 32 is greater than 300 nm.

With reference to all the embodiments described above, the presence of the insulation layer 7 affects the spatial distribution of the concentration $n_s(x)$ of electrons in the 2DEG region, where x is a coordinate measured along the X axis. In particular, the effect of the insulation layer 7 relates to the stress caused by lattice mismatch between the insulation layer 7 and the barrier layer 6 (in other words, the insulation layer 7 and the barrier layer 6 have respective crystal structures which are not symmetrical with respect to one another, and lattice intervals of different sizes). For example, in the embodiments described above, there is a lattice mismatch of 5% between the material of the insulation layer 7 (NiO) and the material of the barrier layer 6 (AlGaN).

In further embodiments, it is possible to use materials other than NiO, for example $CeO_2$, $Gd_2O_3$, or $La_2O_3$, the preparation of which on GaN substrates is discussed in P. Fiorenza et al., "High permittivity cerium oxide thin films on AlGaN/GaN heterostructures", APPLIED PHYSICS LET- TERS 103, 112905 (2013); Jon F. Ihlefeld et al., "AlGaN composition dependence of the band offsets for epitaxial Gd2O3/AlxGa1-xN (0≤x≤0.67) heterostructures", APPLIED PHYSICS LETTERS 105, 012102 (2014); and Jon F. Ihlefeld et al., "Band offsets of La2O3 on (0001) GaN grown by reactive molecular-beam epitaxy", APPLIED PHYSICS LETTERS 102, 162903 (2013).

The effect of the stress caused by the lattice mismatch between the insulation layer 7 and the barrier layer 6 on the concentration of electrons $n_s(x)$ in the 2DEG region may be explained by using the model disclosed by Ambacher, O. et al., "Two-dimensional electron gases induced by spontaneous and piezoelectric polarization charges in N- and Ga-face AlGaN/GaN heterostructures", Journ. of Appl. Phys., vol. 85, no. 6, pp. 3222, 3233, which describes the generation of charges in 2DEG regions of AlGaN/GaN heterostructures by piezoelectric polarization effects.

Figure 4:
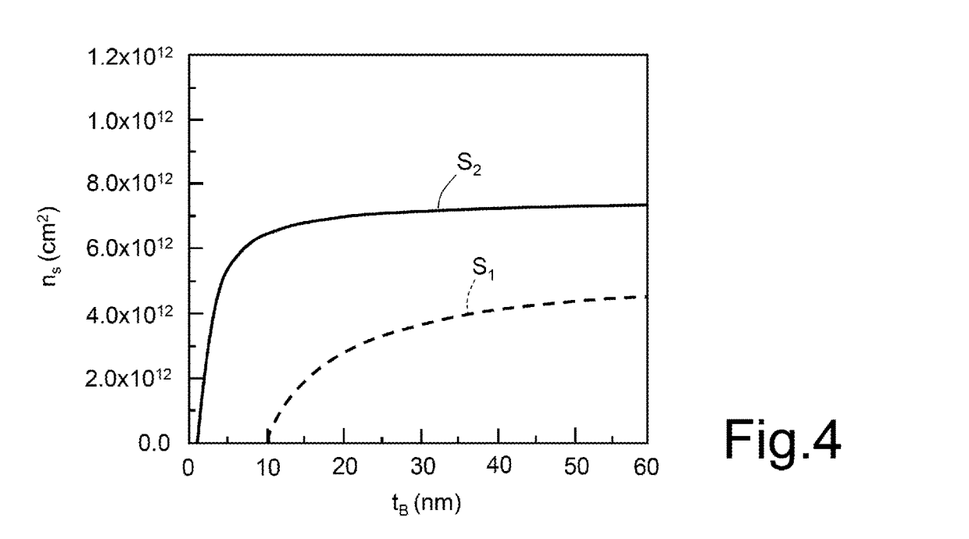
FIG. 4 shows the variations of the concentration of electrons in a 2DEG layer in respective regions of the HEMT transistor according to any of the embodiments shown in FIGS. 1-3.

In particular, it is known that the concentration of electrons $n_s(x)$ of the 2DEG region depends on a mole fraction of aluminum and a thickness of the AlGaN layer that forms the barrier layer 6 in an embodiment of the present disclosure. With reference to FIG. 4, the applicant has found that, for a mole fraction of aluminum of 10% in an AlGaN layer forming the barrier layer 6 and a 10 nm thickness of said layer, the 2DEG region is depleted in the absence of the NiO insulation layer 7 (curve S1 in FIG. 4), while it has an concentration of electrons $n_s(x)>6.0\cdot10^{12}$ cm$^{-2}$ in the presence of the NiO insulation layer 7 (curve S2 in FIG. 4).

Consequently, the barrier layer 6 and the insulation layer 7 have a mismatch of the lattice constant ("lattice mismatch"), which generates a mechanical stress solely in the region of the barrier layer 6 in contact with the insulation layer 7, increasing the concentration $n_s(x)$ of electrons of the two-dimensional conduction channel in a first portion of the latter which is under (that is to say, corresponding to the projection along the Z axis, orthogonal to the plane XY) the region of the barrier layer 6 in contact with the insulation layer 7, relative to a second portion of the two-dimensional conduction channel which is under (that is to say, corresponding to the projection along the Z axis, orthogonal to the plane XY) the region of the barrier layer 6 that is not in contact with the insulation layer 7.

Figure 5A:
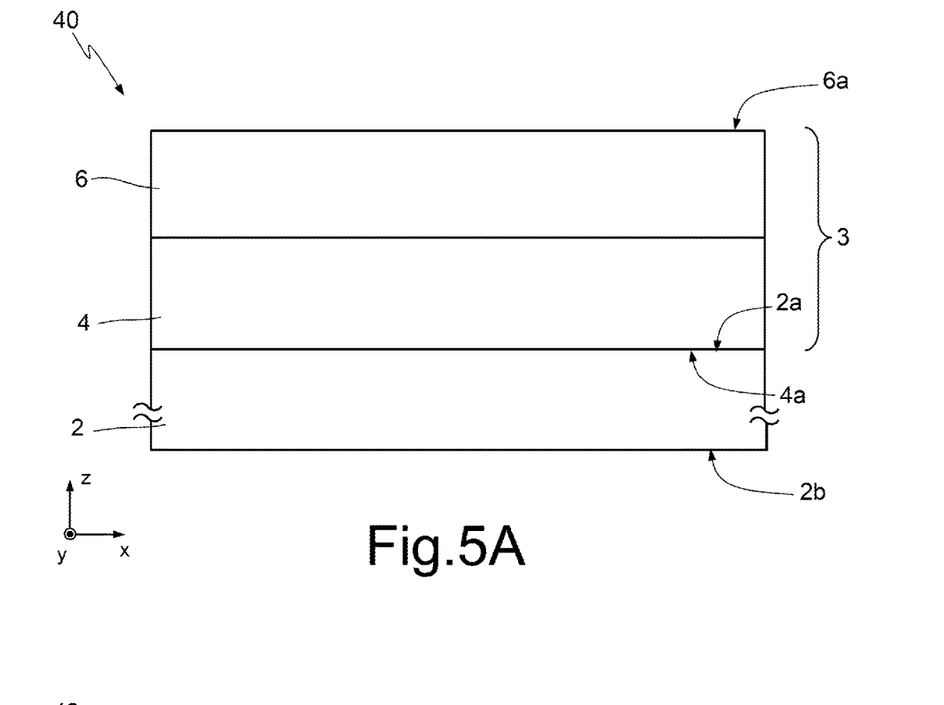
FIGS. 5A-5F show steps of the manufacture of the HEMT transistor of FIG. 1.
Figure 5B:
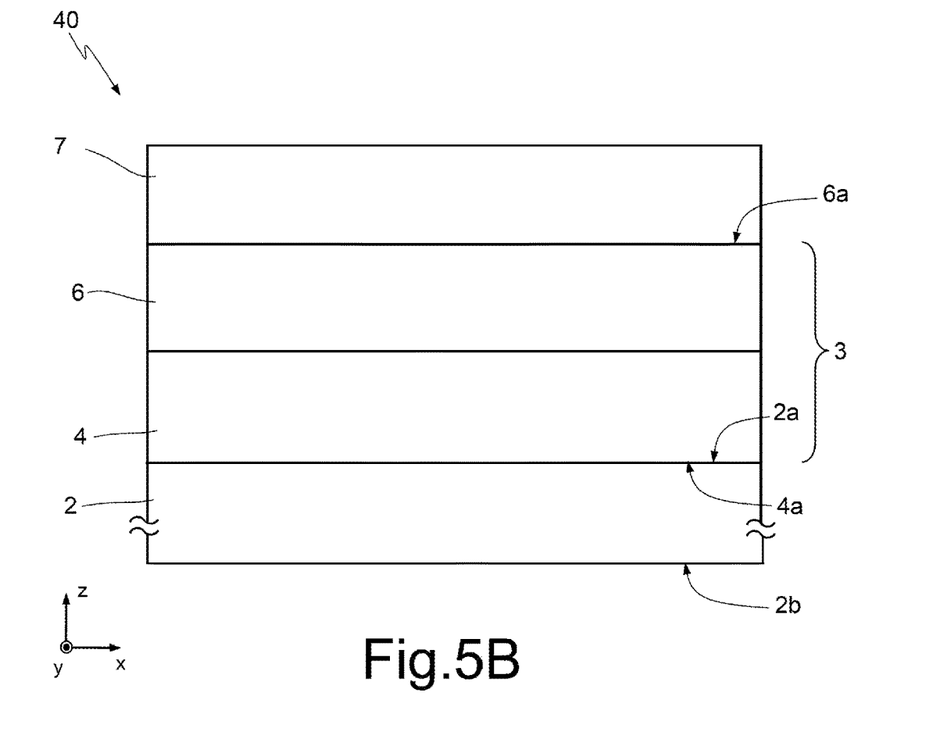

Steps in the manufacture of the HEMT device 1 are described below with reference to FIGS. 5A-5F. FIG. 5A shows, in a cross-sectional view, a portion of a wafer 40 during a step of manufacturing the HEMT device 1, according to an embodiment of the present disclosure. Elements of the wafer 40 common to those described above with reference to FIG. 1 and shown in said FIG. 1 are indicated by the same reference numerals. In particular, in FIG. 5A, the wafer 40 comprising the substrate 2, made for example of silicon (Si) or silicon carbide (SiC) or aluminum oxide (Al$_2$O$_3$), having a face side 2a and a reverse side 2b opposite one another along a direction Z; the channel layer 4, of gallium nitride (GaN), having its lower side 4a extending adjacent to and overlapping the face side 2a of the substrate 2; and the barrier layer 6, of aluminum and gallium nitride (AlGaN), extending on the channel layer 4. The barrier layer 6 and the channel layer 4 form the heterostructure 3.

The insulation layer 7, of dielectric material such as nickel oxide (NiO) with a thickness in the range from 10 nm to 150 nm, is then formed (FIG. 5B) on a face side 6a of the barrier layer 6. The insulation layer 7 is formed by epitaxial growth of NiO on the barrier layer 6 (AlGaN). With reference to Roccaforte, F. et al., "Epitaxial NiO gate dielectric on AlGaN/GaN heterostructures", Appl. Phys. Lett., vol. 100, p. 063511, 2012, it is known that the epitaxial growth of NiO on AlGaN can be carried out by a deposition process called MOCVD ("Metal Organic Chemical Vapour Deposition"). In particular, the insulation layer 7 of nickel oxide is grown by using Ni(tta)$_2$tmeda as the organometallic precursor. Before the growth process, the wafer 40 is cleaned in a mixture of hydrofluoric acid and hydrochloric acid (Hf/HCl) to remove the native oxide on the face side 6a of the barrier layer 6. The deposition is performed in an MOCVD reactor at low pressure (3-4 Torr), using a flow of 150 sccm of argon as the carrier gas and a flow of 200 sccm of oxygen as the reaction gas, keeping the temperature of the organometallic precursor at 160° C. and the temperature of the substrate 2 at 450° C. throughout the deposition time (10 minutes).

Figure 5C:
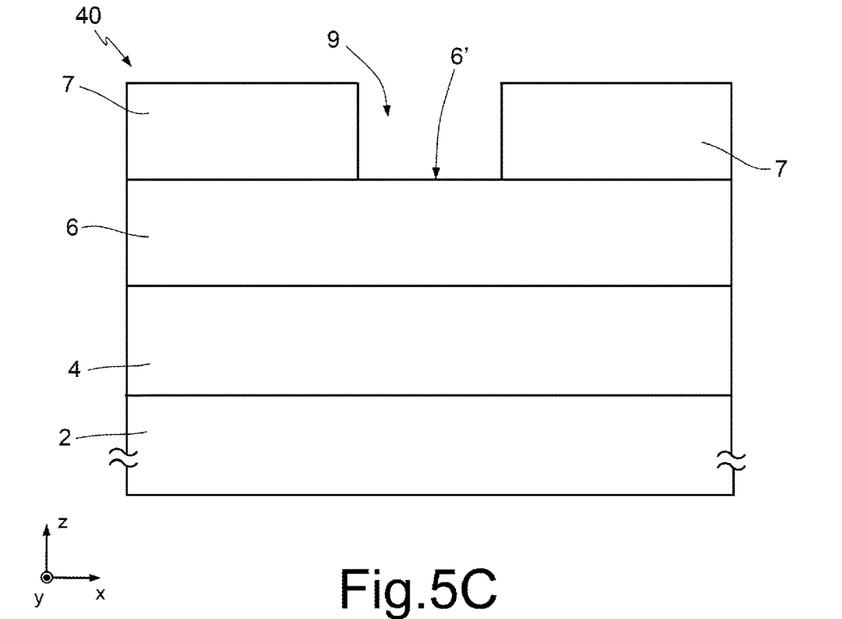

As shown in FIG. 5C, the insulation layer 7 is then selectively removed, by steps of lithography and etching for example, so as to remove selective portions of the layer in the region of the wafer 40 in which the gate region 8 of the HEMT device 1 is to be formed in subsequent steps.

The etching step may cease at the underlying barrier layer 6, as shown in FIG. 5C, or may continue into part of the barrier layer 6, or may completely etch the barrier layer 6. In both cases, a surface portion 6' of the underlying barrier layer 6 is exposed. The etching of the barrier layer 6 is performed, for example, by dry etching. The removed portion of the barrier layer 6 creates a cavity with a depth along Z in the range from 1 nm to 20 nm, for example. In this way, the trench 9 is formed, extending through the whole thickness of the insulation layer 7.

Figure 5D:
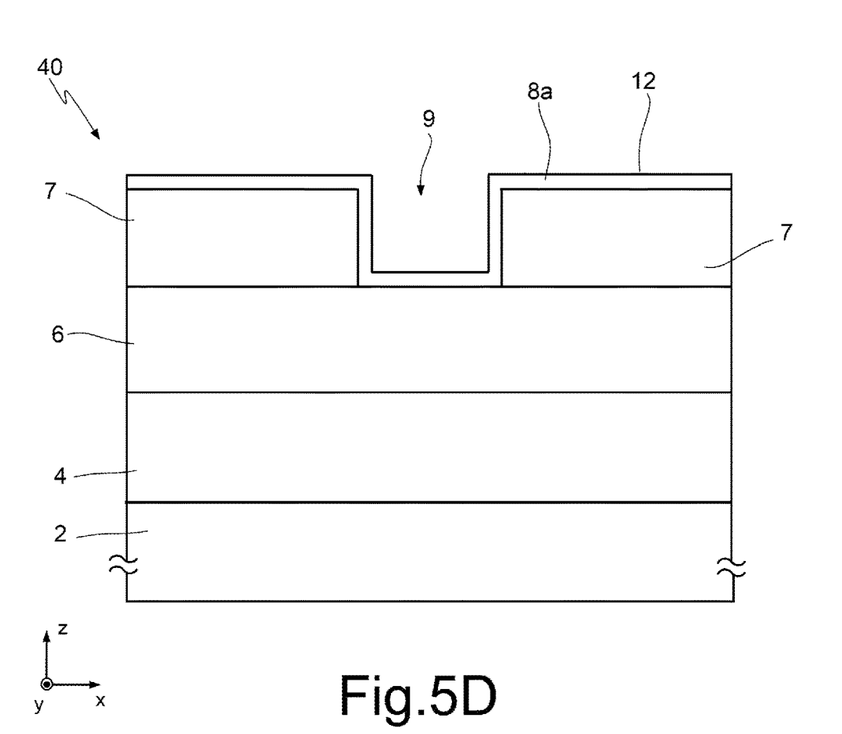

As shown in FIG. 5D, the gate dielectric layer 8a, consisting for example of a material selected from among aluminum nitride (AlN), silicon nitride (SiN), aluminum oxide (Al$_2$O$_3$) and silicon oxide (SiO$_2$), is then formed, by deposition for example. The thickness of the gate dielectric layer 8a is selected to be in the range from 5 nm to 50 nm, for example 30 nm.

Figure 5E:
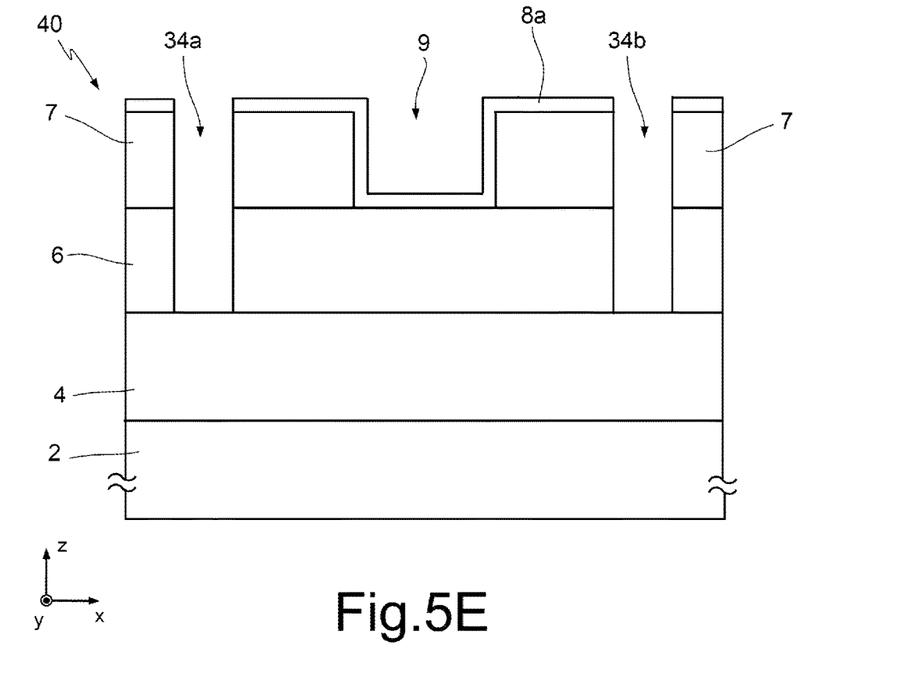

As shown in FIG. 5E, one or more further steps of masked etching of the gate dielectric 8a and the insulation layer 7 are then performed, to remove selective portions of these layers which extend in regions of the wafer 40 in which the source region 10 and the drain region 12 of the HEMT device 1 are to be formed. In particular, apertures 34a and 34b are formed on opposite sides of the trench 9, along the X axis.

Figure 5F:
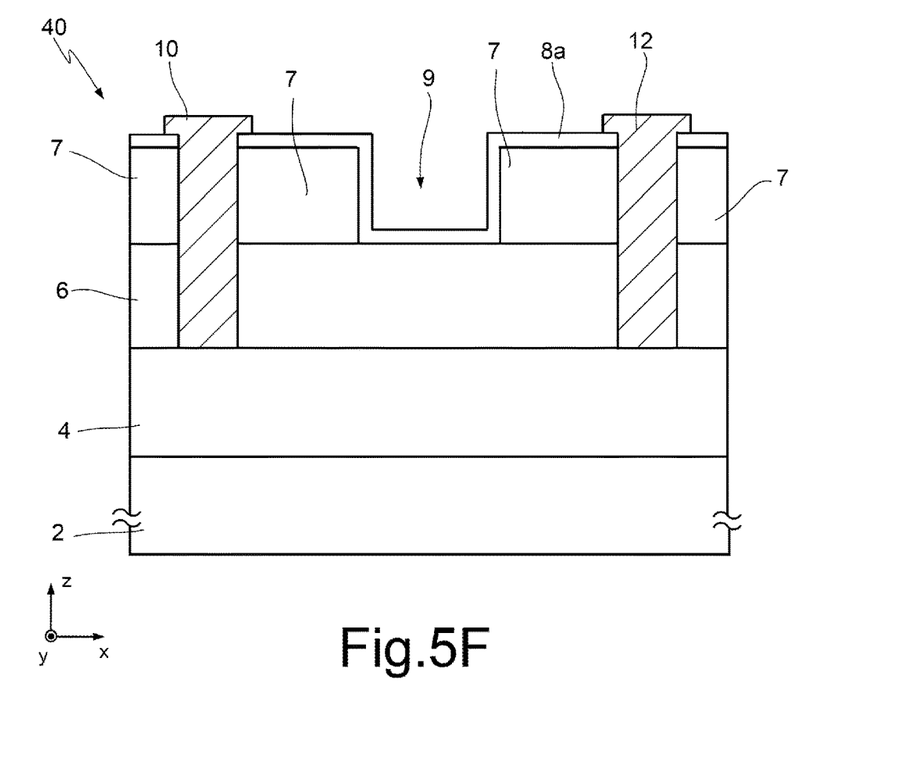

As shown in FIG. 5F, a step of forming ohmic contacts is then performed to produce the source and drain regions 10, 12, by depositing conductive material, particularly metal such as titanium (Ti) or aluminum (Al), or alloys or compounds thereof, by sputtering or evaporation in the apertures 34a, 34b, using known photolithographic methods.

A step of rapid thermal annealing (RTA) is then performed, at a temperature in the range from about 500° C. to 700° C. for example, for a period of 30 s to 120 s, in order to form ohmic contacts between the source region 10 and drain region 12 and the underlying region (containing the two-dimensional gas 2DEG).

A step of deposition of conductive material on the wafer 30 is then carried out to form the gate metallization 8b on the gate dielectric layer 8a, using known photolithographic methods, filling the trench 9 and thus forming the gate region 8. For example, the gate metallization 8b is formed from metallic material such as tantalum (Ta), tantalum nitride (TaN), titanium nitride (TiN), palladium (Pa), tungsten (W), tungsten silicide (WSi$_2$), titanium/aluminum (Ti/Al), or nickel/gold (Ni/Au). In this way the HEMT device 1 shown in FIG. 1 is formed.

The advantages of the disclosure according to the present disclosure are evident from the above description. In particular, the present disclosure makes it possible to provide the normally-off transistor condition without degrading the mobility under the gate region and without limitation of performance due to the presence of leakage currents in the gate region.

Finally, the solution described and illustrated herein can evidently be modified and varied without departing from the protective scope of the present disclosure.

For example, the metallization of the contacts (source, drain and gate) on the face of the wafer may be carried out using any variant known in the literature, for example by forming contacts from AlSiCu/Ti, Al/Ti, W-plug, or other materials.

Additionally, the channel layer 4 and the barrier layer 6 may be made of other materials, selected from among compound materials of the group III-V, for example InGaN/GaN or AlN/GaN.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A normally-off high electron mobility transistor (HEMT) comprising:
    a semiconductor heterostructure including a semiconductor channel layer and a semiconductor barrier layer on the channel layer;
    a two-dimensional conduction channel within the heterostructure;
    an insulation layer in contact with a first surface of the semiconductor barrier layer, the insulation layer having an epitaxial relationship with the semiconductor barrier layer;
    a gate region extending through a whole thickness of the insulation layer and in contact with the semiconductor barrier layer;
    a source electrode extending on a first side of the gate region through the whole thickness of the insulation layer and through the semiconductor barrier layer, terminating at an interface between the semiconductor barrier layer and the channel layer; and
    a drain electrode extending on a second side of the gate region, opposite the first side of the gate region, through the whole thickness of the insulation layer and through the semiconductor barrier layer, and terminating at the interface between the semiconductor barrier layer and the channel layer.

2. The normally-off HEMT transistor according to claim 1, wherein the gate region extends at least partially through the semiconductor barrier layer.

3. The normally-off HEMT transistor according to claim 2, wherein the gate region extends completely through the semiconductor barrier layer.

4. The normally-off HEMT transistor according to claim 1, wherein the channel layer and the semiconductor barrier layer are made of respective compound materials, including group III-V elements, and wherein the insulation layer is made of a material such that a lattice mismatch between the insulation layer and the barrier layer is in a range from 1% to 20%.

5. The normally-off HEMT transistor according to claim 1, wherein the insulation layer is made of nickel oxide, and wherein the semiconductor barrier layer is made of aluminum gallium nitride, has a mole concentration of aluminum in the range from 5% to 20%, and has a thickness in the range from 5 nm to 30 nm.

6. The normally-off HEMT transistor according to claim 1, wherein the gate region includes a gate dielectric and a gate metallization, the gate dielectric being in contact with the semiconductor barrier layer without creating a mechanical stress that would form a two-dimensional conduction channel.

7. The normally-off HEMT transistor according to claim 1, further comprising:
    a buffer layer extending under the channel layer, including impurities configured to generate trap states which promote an emission of holes from the buffer layer, thus forming a layer of negative charges within the buffer layer; and
    a hole supply layer, of P-type doped semiconductor material, extending between the buffer layer and the channel layer.

8. A method for manufacturing a normally-off HEMT transistor, comprising:
    forming a heterostructure, including forming a channel layer and forming a barrier layer on the channel layer;
    generating a two-dimensional conduction channel within the heterostructure;
    forming an insulation layer in contact with a first surface of the barrier layer, the insulation layer having an epitaxial relationship with the barrier layer;
    forming a gate region through an entire thickness of the insulation layer and in contact with the barrier layer;
    forming a source electrode on a first side of the gate region through the whole thickness of the insulation layer and through the barrier layer, to reach an interface between the barrier layer and the channel layer; and
    forming a drain electrode on a second side of the gate region, opposite the first side of the gate region, through the whole thickness of the insulation layer and through the barrier layer, to reach the interface between the barrier layer and the channel layer.

9. The method according to claim 8, wherein the gate region extends at least partially through the barrier layer.

10. The method according to claim 9, wherein the gate region extends completely through the barrier layer.

11. The method according to claim 8, wherein forming the channel layer and the barrier layer comprise selecting respective compound materials, including group III-V elements, and wherein forming the insulation layer comprises selecting a material such that a lattice mismatch epitaxial between the insulation layer and the barrier layer is in a range from 1% to 20%.

12. The method according to claim 8, wherein forming the insulation layer comprises epitaxially growing nickel oxide, and wherein forming the barrier layer includes forming a layer of aluminum gallium nitride, with a mole concentration of aluminum in a range from 5% to 20%, and a thickness in a range from 5 nm to 30 nm.

13. The method according to claim 8, wherein forming the gate region includes forming a gate dielectric and a gate metallization, the gate dielectric being formed in contact with the barrier layer without creating a mechanical stress that would produce a concentration of electrons in the two-dimensional conduction channel.

14. The method according to claim 8, further comprising:
    forming, under the channel layer, a buffer layer including impurities capable of generating trap states which promote emission of holes from the buffer layer, thus forming a layer of negative charges within the buffer layer; and forming a hole supply layer, of P-type doped semiconductor material, between the buffer layer and the channel layer.

15. A normally-off HEMT transistor, comprising:
a semiconductor heterostructure including a semiconductor channel layer and a semiconductor barrier layer on the channel layer;
an insulation layer directly on a first region of the barrier layer;
a gate region extending completely through the insulation layer and contacting a second region of the barrier layer, wherein the insulation layer and the barrier layer have a mismatch of lattice constants, which generates a two-dimensional conduction channel at an interface between the first region of the barrier layer and the channel layer without forming the two-dimensional conduction channel at an interface between the second region of the barrier layer and the channel layer;
a source electrode on a first side of the gate region through a whole thickness of the insulation layer and the barrier layer, to reach the interface between the barrier layer and the channel layer; and
a drain electrode on a second side of the gate region, opposite the first side of the gate region, through the whole thickness of the insulation layer and the barrier layer, to reach the interface between the barrier layer and the channel layer.

16. The normally-off HEMT transistor according to claim 15, wherein the insulation layer comprises nickel oxide, and the barrier layer includes a layer of aluminum gallium nitride, with a mole concentration of aluminum in a range from 5% to 20%.

17. The normally-off HEMT transistor according to claim 15, further comprising:
a buffer layer extending under the channel layer, including impurities capable of generating trap states which promote emission of holes from the buffer layer, thus forming a layer of negative charges within the buffer layer; and
a hole supply layer, of P-type doped semiconductor material, between the buffer layer and the channel layer.

18. A normally-off high electron mobility transistor (HEMT) comprising:
a semiconductor heterostructure including a semiconductor channel layer and a semiconductor barrier layer on the channel layer;
a two-dimensional conduction channel within the heterostructure;
an insulation layer in contact with a first surface of the barrier layer, the insulation layer having an epitaxial relationship with the barrier layer;
a buffer layer extending under the channel layer, including impurities configured to generate trap states which promote an emission of holes from the buffer layer, thus forming a layer of negative charges within the buffer layer;
a hole supply layer, of P-type doped semiconductor material, extending between the buffer layer and the channel layer;
a source electrode extending on a first side of a gate region and in direct electrical contact with the hole supply layer;
a drain electrode extending on a second side of the gate region, opposite the first side of the gate region, through the whole thickness of the insulation layer and through the barrier layer, and terminating at an interface between the barrier layer and the channel layer; and
a gate region extending through a whole thickness of the insulation layer and in contact with the barrier layer.

19. A normally-off HEMT transistor, comprising:
a semiconductor heterostructure including a semiconductor channel layer and a semiconductor barrier layer on the channel layer;
an insulation layer directly on a first region of the barrier layer;
a buffer layer extending under the channel layer, including impurities capable of generating trap states which promote emission of holes from the buffer layer, thus forming a layer of negative charges within the buffer layer;
a hole supply layer, of P-type doped semiconductor material, between the buffer layer and the channel layer;
a source electrode on a first side of a gate region and in direct electrical contact with the hole supply layer;
a drain electrode on a second side of the gate region, opposite the first side of the gate region, through the whole thickness of the insulation layer and the barrier layer, to reach the interface between the barrier layer and the channel layer; and
a gate region extending completely through the insulation layer and contacting a second region of the barrier layer, wherein the insulation layer and the barrier layer have a mismatch of lattice constants ("lattice mismatch"), which generates a two-dimensional conduction channel at an interface between the first region of the barrier layer and the channel layer without forming the two-dimensional conduction channel at an interface between the second region of the barrier layer and the channel layer.

20. A method for manufacturing a normally-off HEMT transistor, comprising:
forming a heterostructure, including forming a channel layer and forming a barrier layer on the channel layer;
generating a two-dimensional conduction channel within the heterostructure;
forming an insulation layer in contact with a first surface of the barrier layer, the insulation layer having an epitaxial relationship with the barrier layer;
forming, under the channel layer, a buffer layer including impurities capable of generating trap states which promote emission of holes from the buffer layer, thus forming a layer of negative charges within the buffer layer;
forming a hole supply layer, of P-type doped semiconductor material, between the buffer layer and the channel layer;
forming a source electrode on a first side of a gate region and in direct electrical contact with the hole supply layer;
forming a drain electrode on a second side of the gate region, opposite the first side of the gate region, through the whole thickness of the insulation layer and through the barrier layer, to reach an interface between the barrier layer and the channel layer; and forming a gate region through an entire thickness of the insulation layer, in contact with the barrier layer.

* * * * *

UNITED STATES PATENT AND TRADEMARK OFFICE
CERTIFICATE OF CORRECTION

PATENT NO. : 11,038,047 B2
APPLICATION NO. : 16/738935
DATED : June 15, 2021
INVENTOR(S) : Ferdinando Iucolano et al.

Page 1 of 1

It is certified that error appears in the above-identified patent and that said Letters Patent is hereby corrected as shown below:

On the Title Page

In the field "Related U.S. Application Data,":
Below item (63), should read,
--Foreign Application Priority Data
June 09, 2017 (IT)..........102017000064147--.

In the Claims

Column 7, Line 64, Claim 4:
"and the barrier" should read, --and the semiconductor barrier--.

Signed and Sealed this
Seventh Day of September, 2021

Drew Hirshfeld
*Performing the Functions and Duties of the*
*Under Secretary of Commerce for Intellectual Property and*
*Director of the United States Patent and Trademark Office*